United States Patent
Shum

(10) Patent No.: US 8,529,797 B2
(45) Date of Patent: Sep. 10, 2013

(54) PEROVSKITE SEMICONDUCTOR THIN FILM AND METHOD OF MAKING THEREOF

(76) Inventor: Kai Shum, Orefield, PA (US)

( * ) Notice: Subject to any disclaimer, the term of this patent is extended or adjusted under 35 U.S.C. 154(b) by 36 days.

(21) Appl. No.: 13/151,243

(22) Filed: Jun. 1, 2011

(65) Prior Publication Data

US 2012/0305918 A1 Dec. 6, 2012

(51) Int. Cl.
*C09B 67/00* (2006.01)
(52) U.S. Cl.
USPC .................. 252/501.1; 252/520.1; 204/192.1
(58) Field of Classification Search
USPC ............... 252/518.1, 519.34, 520.1, 301.4 R, 252/501.1
See application file for complete search history.

(56) References Cited

U.S. PATENT DOCUMENTS

| 4,244,722 | A * | 1/1981 | Tsuya et al. | 65/32.5 |
| 2009/0095341 | A1* | 4/2009 | Pfenninger et al. | 136/246 |
| 2010/0224248 | A1* | 9/2010 | Kenney et al. | 136/259 |

OTHER PUBLICATIONS

Shum, K., et. al., "Synthesis and characterization of CsSnl3 thin films," Applied Physics Letters, 96, 221903 (2010), pub. online Jun. 2, 2010.*
Yamada, K., et. al., Chemistry Letters, pp. 801-804, 1991.*

* cited by examiner

*Primary Examiner* — Mark Kopec
*Assistant Examiner* — William Young

(57) ABSTRACT

Perovskite semiconductor thin films and the method of making Perovskite semiconductor thin films are disclosed. Perovskite semiconductor thin films were deposited on inexpensive substrates such as glass and ceramics. $CsSnI_3$ films contained polycrystalline domains with typical size of 300 nm and larger. It is confirmed experimentally that $CsSnI_3$ compound in its black phase is a direct band-gap semiconductor, consistent with the calculated band structure from the first principles.

10 Claims, 5 Drawing Sheets

PEROVSKITE SEMICONDUCTOR THIN FILM AND METHOD OF MAKING THEREOF

BACKGROUND OF THE INVENTION

Perovskite semicomductor thin films exhibit outstanding optical, electrical, and ferroelectric properties. This feature makes perovskite films ideally suited for a wide range of applications such as light emitting and photovoltaic devices.

D. Scaife, P. Weller, and W. Fisher, reported an early study on the structural information of $CsSnI_3$ compound in form of powders, J. Solid State Chem. 9, 308 (1974).

P. Mauersberger and F. Huber, synthesized a yellow, needle-like $CsSnI_3$ microcrystal, and studied its crystal structure, Acta Cryst. B 36, 683 (1980).

K. Yamada, S. Funabiki, H. Horimoto, T. Matsui, T. Okuda, and S. Ichiba, reported the polymorph nature of $CsSnI_3$ compound, Chem. Lett. (The Chemical Society of Japan) 20, 801 (1991).

The black polymorph of $CsSnI_3$ could be obtained through a phase transition from the yellow polymorph $CsSnI_3$ by increasing its temperature above 425 K. It was further demonstrated by differential thermal analysis and X-ray diffraction that during the cooling of the black $CsSnI_3$ from 450 K, its ideal cubic perovskite structure (B-α) deformed to a tetragonal structure (B-β) at 426 K, and became an orthorhombic structure (B-γ) below 351 K. Experimental studies of electrical and optical properties of this compound have been hindered by lack of high quality $CsSnI_3$ samples either in bulk or thin film format.

Aiming at the unique properties of hybrid organic-inorganic perovskites based on tin halides, I. Borriello, G. Gantel, and D. Ninno, recently calculated band structures of B-α, B-β, and B-γ from the first principles using the crystal structures published by Yamada et al., Phys. Rev. B 77, 235214 (2008). It was concluded that all three structures had direct band-gap ($E_g$) at Z, R, and Γ points for B-α, B-β, and B-γ, respectively, with $E_g$ (B-α)<$E_g$ (B-β)<$E_g$ (B-γ).

A need still exists in the industry for developing perovskite semiconductor thin films, especially with large domain size. The successful implementation of these materials for various application requires a detailed understanding of both their processing and materials properties.

BRIEF SUMMARY OF THE INVENTION

This invention is directed to large domain size high quality perovskite semiconductor thin films and effective and inexpensive methods to synthesize the films on large-area substrates such as glass, ceramics and silicon.

One embodiment of this invention is directed to a polycrystalline perovskite semiconductor thin film comprising $CsM_1(M_2)_3$;

wherein $M_1$ is selected from the group consisting of Sn, Pb and combination thereof; and $M_2$ is selected from the group consisting of I, Cl, Br and combinations thereof.

Example for the above thin film are $CsSnI_3$: wherein $M_1$ is Sn; $M_2$ is I; and $CsSnCl_3$: wherein $M_1$ is Sn; $M_2$ is $Cl_3$; and $CsSnBr_3$: wherein $M_1$ is Sn; $M_2$ is Br.

Another embodiment of this invention is directed to the method for producing a polycrystalline perovskite semiconductor film $CsM_1(M_2)_3$ on a substrate comprising steps of:
  providing a substrate;
  depositing a high purity layer of $M_1(M_2)_2$;
  depositing a high purity layer of $CsM_2$;
  repeating the depositing steps until a desired number of alternate layers is reached;
  applying energy to activate a self-limiting chemical reaction of $M_1(M_2)_2$ with $CsM_2$ forming the polycrystalline perovskite semiconductor film $CsM_1(M_2)_3$;
  wherein $M_1$ is selected from the group consisting of Sn, Pb and combination thereof; and $M_2$ is selected from the group consisting of I, Cl, Br and combinations thereof.

Yet, another embodiment of this invention is directed to the method for producing a polycrystalline perovskite semiconductor film $CsSnI_3$ on a substrate comprising steps of:
  providing a substrate;
  depositing a high purity layer of $Sn(M_1)_2$;
  depositing a high purity layer of CsI;
  repeat the depositing steps until a desired number of alternate layers is reached;
  applying a rapid thermal annealing to activate a self-limiting chemical reaction of $Sn(M_1)_2$ with CsI forming the polycrystalline perovskite semiconductor film $CsSnI_3$;
  wherein $M_1$ is selected from the group consisting of I, Cl, Br and combinations thereof.

DETAILED DESCRIPTION OF THE INVENTION

Figure 1:
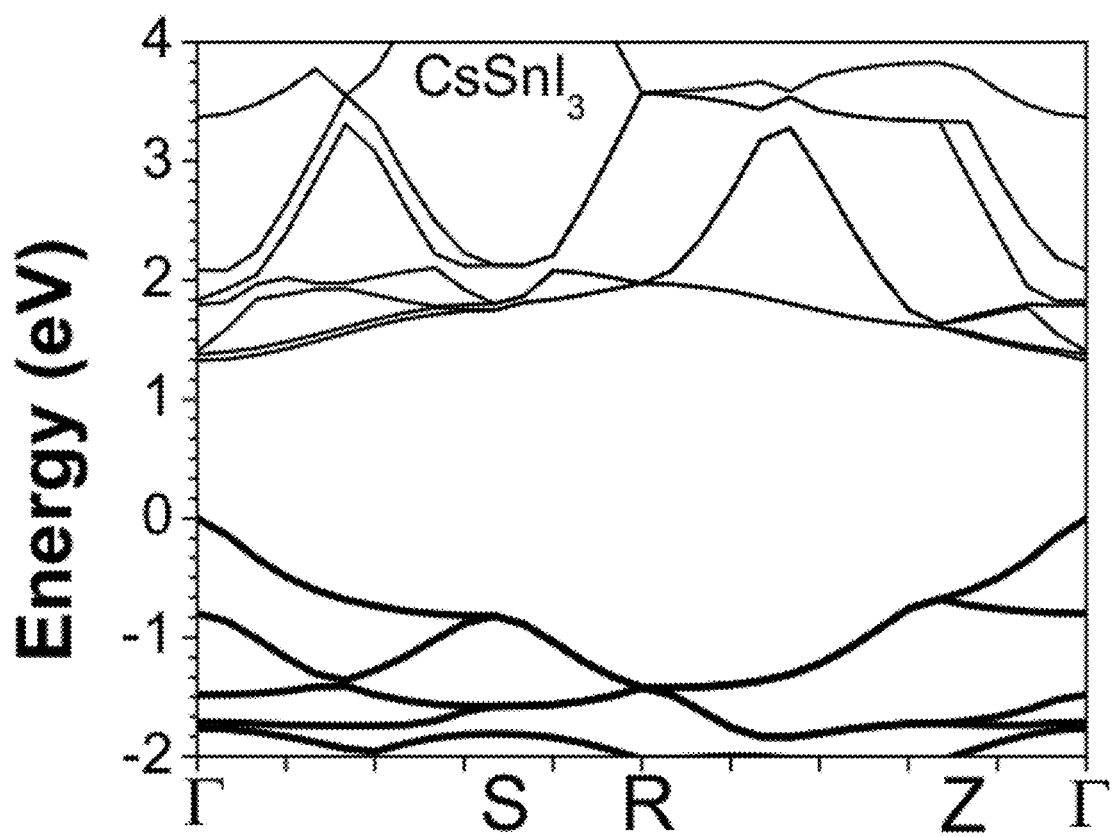
FIG. 1 shows the calculated electronic band structure of $CsSnI_3$. Six top valence bands are displayed as thick curves while six bottom conduction bands are shown as thin curves. The theoretically calculated band-gap value from the first principle is known to be underestimated; the experimentally measured band-gap value of ~1.3 eV at 300 K was used.

An effective and inexpensive method to synthesize large domain size high quality perovskite semiconductor thin films on large-area substrates such as glass, ceramics and silicon are disclosed in the present invention.

Working Examples

The polycrystalline $CsSnI_3$ thin films were synthesized by following steps. The large domain sizes of 300 nm and larger (such as 3000 nm) were obtained. The domain size is defined as X, Y and Z, three dimensions. For example, domain sizes of 300 nm meant X, Y or Z is 300 nm, respectively.

CsSnI$_3$ Thin Films Using SnI$_2$ and CsI

CsSnI$_3$ thin films using SnI$_2$ and CsI were synthesized by following steps:
 providing a substrate;
 depositing a high purity layer of SnI$_2$ using thermal evaporator,
 depositing a high purity layer of CsI on the top of Sn$_{I2}$ layer using e-beam evaporator,
 repeat the depositing steps until a desired number of alternate layers was reached;
 applying a rapid thermal annealing to activate a self-limiting chemical reaction of CsI with SnI$_2$.

The depositing steps have been carried out in a vacuum with $10^{-4}$~$10^{-6}$ Torr, preferably $10^{-5}$ Torr; the deposition temperature ranged from 15° C. to 35° C., preferably 25° C.; the rapid thermal annealing timed ranging from 10 s-20 s, preferably 15 s; the rapid thermal annealing temperature ranged from 320° C. to 420° C., preferably 370° C.; the rapid thermal annealing were carried out in an inert gas environment, such as, but not limited to N$_2$, Ar gas. A total layers ranged from 2 to 100. The high purity is 99.99%.

While not wishing to be bound by theory, for the fixed 1-to-1 stoichoimetric ratio, the chemical formula for the CsI/SnI$_2$ reaction is: CsI+SnI$_2$→CsSnI$_3$;

CsSnI$_3$ Thin Films Using SnCl$_2$ and CsI

CsSnI$_3$ thin films using SnCl$_2$ and CsI were synthesized by following steps:
 providing a substrate;
 depositing a high purity layer of SnCl$_2$ using thermal evaporator;
 depositing a high purity layer of CsI on the top of SnCl$_2$ layer using e-beam evaporator;
 repeat the depositing steps until a desired number of alternate layers was reached;
 applying a rapid thermal annealing to activate a self-limiting chemical reaction of CsI with SnCl$_2$.

The depositing steps have been carried out in a vacuum with $10^{-4}$~$10^{-6}$ Torr, preferably $10^{-5}$ Torr; the deposition temperature ranged from 15° C. to 35° C., preferably 25° C.; the rapid thermal annealing timed ranging from 10-20 s, preferably 15 s; the rapid thermal annealing temperature ranged from 170° C. to 210° C., preferably 190° C.; the rapid thermal annealing were carried out in an inert gas environment or in air, the inert gas were, but not limited to N$_2$, Ar gas; a total layers ranged from 2 to 100.

While not wishing to be bound by theory, for the fixed 1-to-1 stoichoimetric ratio, the chemical formula for the CsI/SnCl$_2$ reaction, three possible reactions that lead to CsSnI$_{3-x}$Cl$_x$ (x=0, 1, 2, and 3) structures are: 1) CsI+SnCl$_2$→CsSnICl$_2$, 2) 2CsI+2SnCl$_2$→CsSnI$_2$Cl+CsSnCl$_3$, and 3) 3CsI+3 SnCl$_2$→CsSnI$_3$+2 CsSnCl$_3$.

CsSnI$_3$ Thin Films Using SnBr$_2$ and CsI

CsSnI$_3$ thin films using SnBr$_2$ and CsI were synthesized by following steps:
 providing a substrate;
 depositing a high purity layer of SnBr$_2$ using thermal evaporator;
 depositing a high purity layer of CsI on the top of SnBr$_2$ layer using e-beam evaporator;
 repeat the depositing steps until a desired number of alternate layers was reached;
 applying a rapid thermal annealing to activate a self-limiting chemical reaction of CsI with SnBr$_2$.

The depositing steps have been carried out in a vacuum with $10^{-4}$~$10^{-6}$ Torr, preferably $10^{-5}$ Torr; the deposition temperature ranged from 15° C. to 35° C., preferably 25° C.; the rapid thermal annealing timed ranging from 10-20 s, preferably 15 s; the rapid thermal annealing temperature ranged from 170° C. to 210° C., preferably 190° C.; the rapid thermal annealing were carried out in an inert gas environment or in air, the inert gas were, but not limited to N$_2$, Ar gas; a total layers ranged from 2 to 100.

While not wishing to be bound by theory, for the fixed 1-to-1 stoichoimetric ratio, the chemical formula for the CsI/SnBr$_2$ reaction, three possible reactions that lead to CsSnI$_{3-x}$Br$_x$ (x=0, 1, 2, and 3) structures are: 1) CsI+SnBr$_2$→CsSnIBr$_2$, 2) 2CsI+2SnBr$_2$→CsSnI$_2$Br+CsSnBr$_3$, and 3) 3CsI+3 SnBr$_2$→CsSnI$_3$+2 CsSnBr$_3$.

Characterization of CsSnI$_3$ Thin Films

Different stoichoimetric ratios of CsI to SnI$_2$ or SnCl$_2$ have been experimented. The resulting films always gave a characteristic PL emission peak around 950 nm although its intensity varies slightly.

Various samples have been characterized using X-ray fluorescence (XRF) and energy dispersive X-ray analysis (EDS). For an example, with the 1-to-1 ratio of CsI/SnI$_2$, an atom ratio was found by XRF to be 1:0.9:2.3 for Cs:Sn:I after annealing, indicating slight loss of tin and iodine atoms during annealing. The EDS spectra were also acquired at various locations of annealed samples with no separated regions of CsI and SnI$_2$ (or SnCl$_2$ in case of CsI/SnCl$_2$ layered samples).

Both CsI/SnI$_2$ and CsI/SnCl$_2$ layered thin film samples gave an intense characteristic PL around 950 nm. The possible side products for the CsI/SnCl$_2$ layered samples were CsSnCl$_3$, CsSnICl$_2$, and CsSnI$_2$Cl. The first two had much larger band gaps than that of CsSnI$_3$, while the last one had a smaller band-gap than that of CsSnI$_3$. Very weak PL relative to the 950 nm emission were observed for a CsI/SnCl$_2$ layered sample and their PL peak positions were consistent with the calculated band-gaps for CsSnCl$_3$ and CsSnICl$_2$. No PL or absorption features around 1.5 µm were observed corresponding to the CsSnI$_2$Cl band gap. Hence these possible side products from CsI/SnCl$_2$ layered samples did not affect the intense band edge emission of CsSnI$_3$ reported here.

Optical absorption and photoluminescence (PL) methods were used to demonstrate that this compound is indeed a direct band-gap semiconductor, consistent with the calculated from the first principles. The value of its band-gap was determined to be ~1.3 eV at room temperature.

CASTEP simulation tool from Accelrys was used for this work. The computational results on the total potential energy and electronic states of a given crystal structure were based on the density functional module CASTEP. Prior to the energy band structure calculation of a crystal structure, the type of crystal structure was determined by an energy minimization procedure in which the potential energy was calculated by varying a lattice scaling factor, by fine-tuning the Sn—I—Sn (or Sn—Cl—Sn) titling angles in ab-plane and in c-direction, as well as by changing Cs positions.

The band structure of CsSnI$_3$ based on the energy-minimized structural coordinates was shown in FIG. 1. Three important features of the electronic states near the band edges should be pointed out.

First, it was clear shown that a direct band-gap semiconductor with a band-gap at Γ(x,y) symmetry point. Other symmetry points shown in FIG. 1 were: S ($-0.5a_k$, $0.5b_k$, 0), Z (0, 0, $0.5c_k$), and R ($-0.5a_k$, $0.5b_k$, $0.5c_k$), where $a_k=\pi/a$, $b_k=\pi/b$, and $c_k=\pi/c$.

Second, the curvature of the lowest conduction band (CB1) was about 2 times smaller than the top valance band (VB1) indicating that the electron effective mass is larger than that of holes.

Third, there was another conduction band (CB2) closely adjacent to CB1. They were parallel to each other in momentum space from Γ to S point. The electronic states of the CB1 was the p-orbital of the central tin atom of the $SnI_6$ octahedron; while the p- and s-orbital of the 6 outer iodine atoms of the octahedron equally contributed to the CB2 states. The electronic states of VB1 originated mainly from the p-orbital of iodine atoms.

These thin films were characterized by the surface and cross-section scanning electron microscopy and transmission electron microscopy (TEM). The films were polycrystalline with a typical domain size of ~300 nm. TEM images were taken from several selected areas, showing different lattice spacing due to different crystal orientations.

Figure 2:
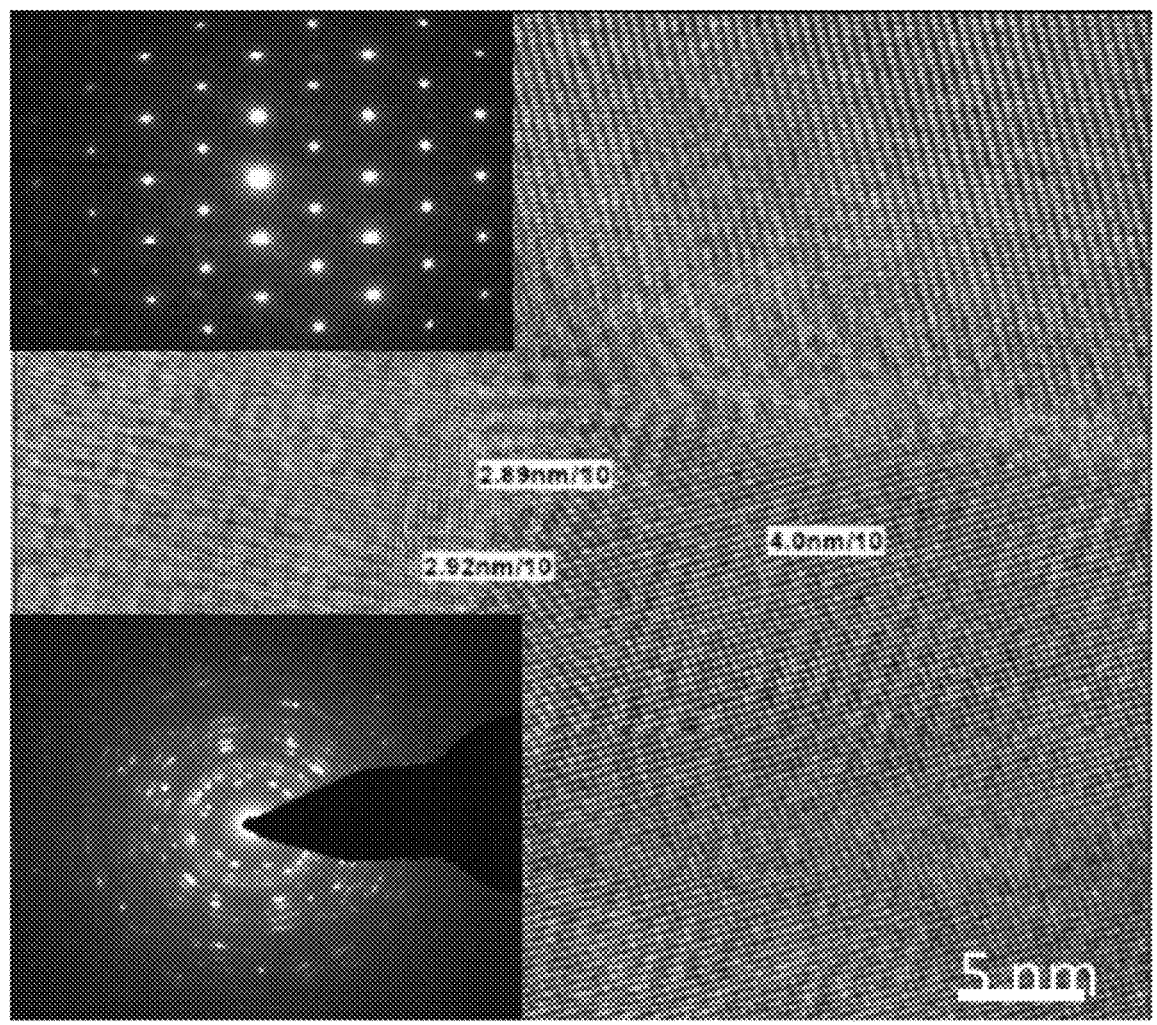
FIG. 2 shows the high resolution Transmission Electron Microscope (TEM) image in a triple-domain area. Bottom-left inset: Electron diffraction pattern in a selected area where many domains are orientated in different directions. Top-left inset: an electron diffraction pattern in a selected area where a single large domain exists.

FIG. 2 showed the TEM image of a $CsSnI_3$ film on a glass substrate in a triple-domain area. Electron diffraction patterns were also measured.

The polycrystalline films gave typical ring-like patterns, as shown by the bottom-left inset in FIG. 2. In large domain areas, electron diffraction patterns can present single crystal features. The measured electron diffraction patterns were displayed in the top-left inset of FIG. 2.

CrystalMaker simulation package from CrystalMaker was used to generate the electron diffraction pattern.

Twenty sets of crystal planes in the [201] direction of theoretical crystal structure $CsSnI_3$ were matched. The matching planes in sequence of diffraction efficiency from 47 to 3% are: (-2 2 4), (-2 -2 4), (2, -2 4), (2 2 -4), (0 -4 0), (0 4 0), (0 -2 0), (0 2 0), (-1 -3 2), (1 -3 -2), (-1 3 2), (1 3 -2), (-1 -1 2), (1 -1 -2), (-1 1 2), (1 1 -2), (-2 0 4), (-2 0 4), (-2 4 4) and (-2 4 4).

Figure 3:
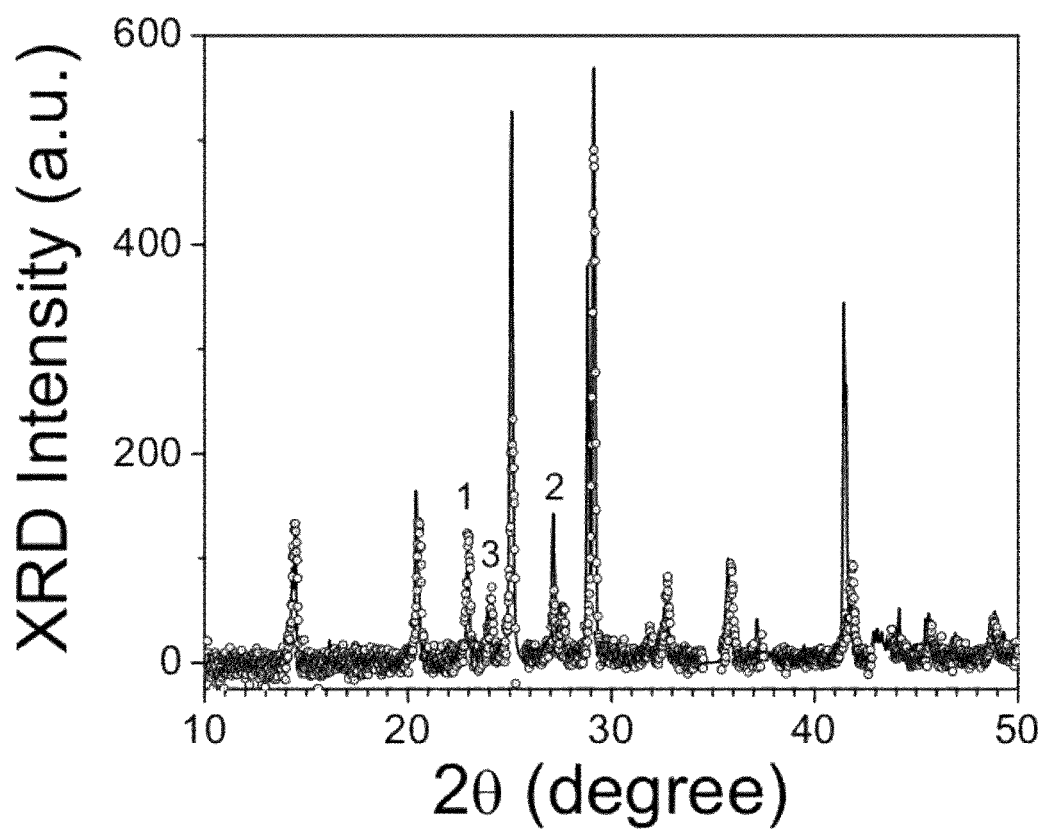
FIG. 3 shows the measured X-ray diffraction intensity (open circles) as a function of 2θ, compared with the calculated curve, matching main features of the γ-crystal structure of $CsSnI_3$ as indicated by "1, 2, and 3". The X-ray diffraction data (XRD) peaks from the ceramic substrate are removed for clarity.

The crystal structure of polycrystalline films was further verified by X-ray diffraction (XRD) data and was shown in FIG. 3 as the open-circle curve using a $CsI/SnI_2$ layered sample with a one-to-one stoichoimetric ratio on a ceramic substrate. The numbers of "/1" and "2" indicated the expected XRD features of the Sn—I—Sn bond tilting in the a-, and b-directions, respectively, while "3" represented the signature of the Sn—I—Sn bond tilting in the c-direction. These features matched the calculated XRD intensity (solid curve) for $CsSnI_3$.

PL spectra were extensively used to characterize the synthesized films under various conditions. They were taken from a Nanolog system from Horiba Jobin Yvon. The system consists of a light source (450 W Xe-lamp), a double-grating excitation spectrometer to select a central excitation wavelength and its bandwidth, a sample compartment either fiber-coupled or in free-space to collect PL, and an emission spectrometer to spectrally select desired emission to a photomultiplier tube (Hamamatsu P2658P) coupled with single photon counting electronic circuits. Photoexcitation level is low and is about 20 mW/cm².

Absorption spectra of $CsSnI_3$ thin films were measured by a Lambda-950 UV-VIS-IR spectrometer equipped with a 60 mm integrating sphere from Perkin Elmer.

The annealing temperature ($T_a$) and time duration ($\Delta t_a$) dependences of the characteristic PL from $CsSnI_3$ thin films were studied. The results indicated that the peak position of PL did not depend on either annealing temperature or time duration used for the annealing. However, the intensity of PL was found strongly dictated by annealing conditions.

The optimal condition for the strongest PL intensity depended on a given sample. For a thin film with $CsI/SnCl_2$ layers on a glass substrate, a typical annealing temperature of ~190° C. with time duration of ~15 s resulted in a good polycrystalline film having very intense PL at ~950 nm. For a film with $CsI/SnI_2$ layers, the annealing temperature was higher than 190° C., since the melting temperature of $SnI_2$ (320° C.) is higher than that of $SnCl_2$ (247° C.).

Figure 4:
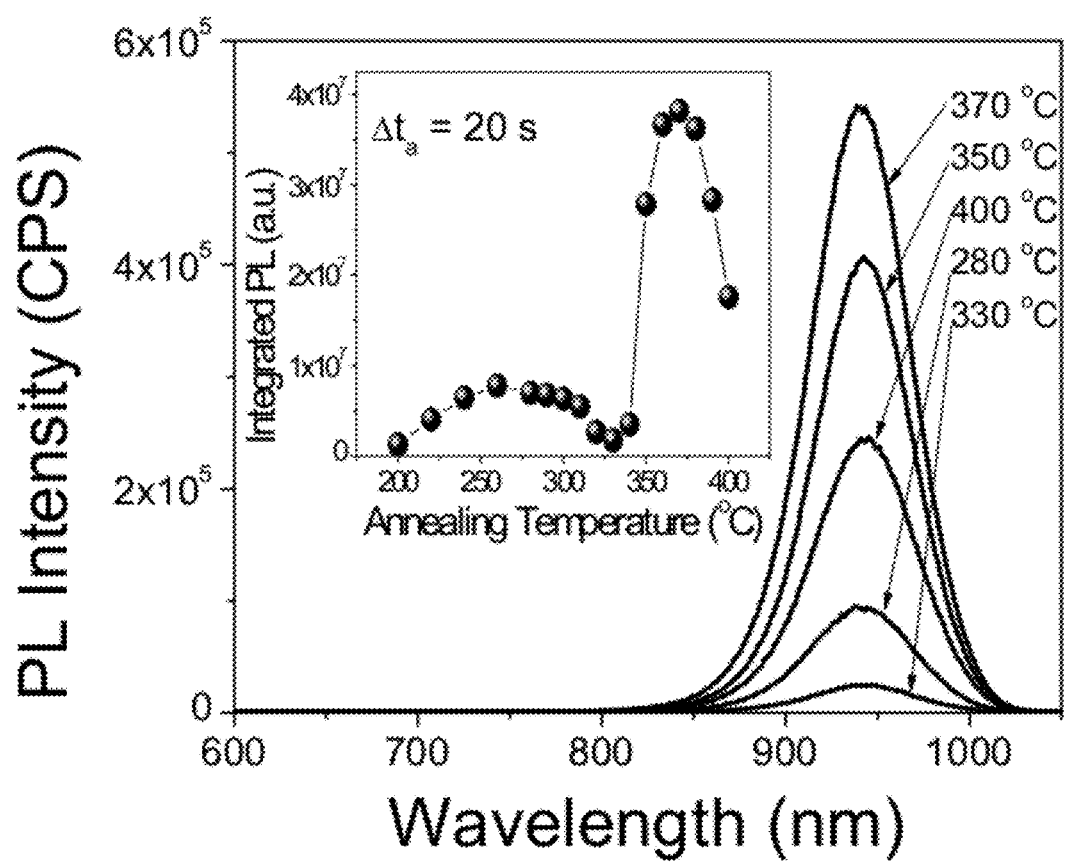
FIG. 4 shows the photoluminescence (PL) spectra of $CsI/SnI_2$ layered samples cut from the same silicon substrate taken at different thermal annealing temperatures as indicated. The inset displays the integrated PL spectrum at different annealing temperatures.

The PL spectra taken from the selected pieces of $CsI/SnI_2$ layered samples cut from a same Si substrate annealed at different temperatures for 20 s, were displayed in FIG. 4. The integrated area of PL spectrum at each annealing temperature was summarized in the inset of the figure, and it had two regions: below and above 330° C. which is close to the melting temperature of $SnI_2$.

The PL spectra indicated that the characteristic PL started as low as 200° C. and reached to a local maximum at 260° C. before weakening to near zero level. Right after 330° C., it immediately extended to the second maximum around 370° C., which was 4 times larger than the PL intensity at 260° C.

$CsSnI_3$ films would degrade in a few days under a normal ambient condition without any protections. However, if they were stored in dry $N_2$ gas or encapsulated, the degradation was minimized.

Figure 5:
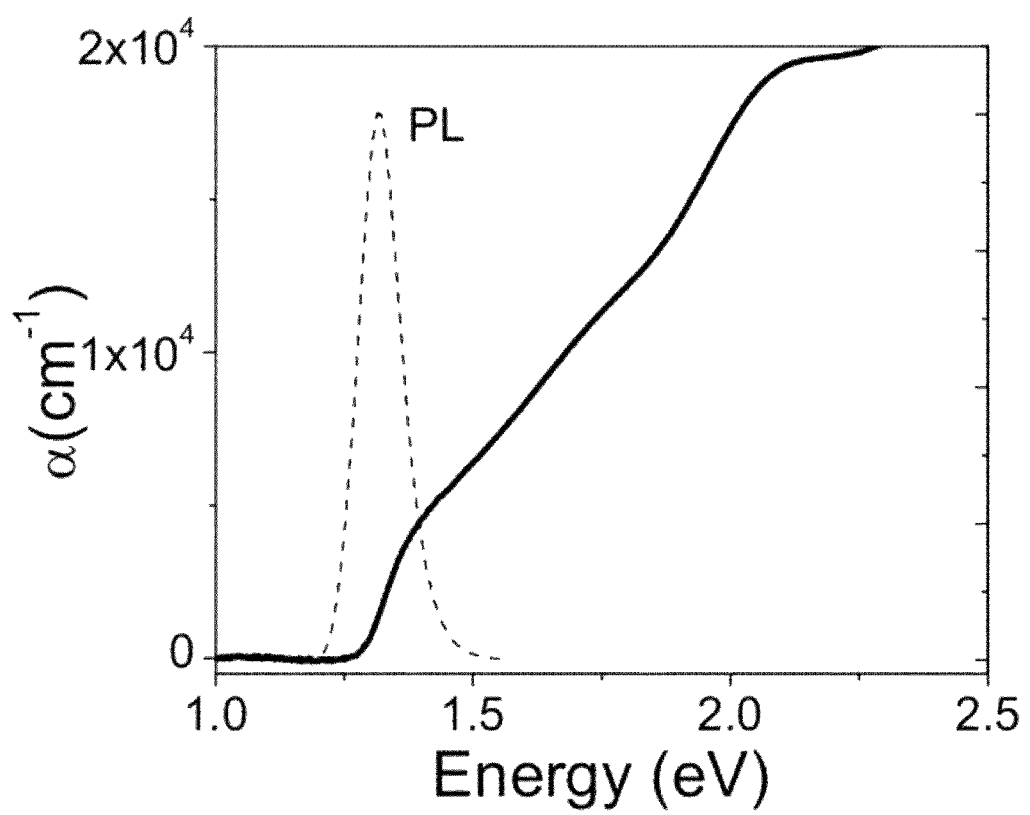
FIG. 5 shows the measured absorption (thick curve) and photoluminescence (PL) spectra at room temperature (dash-curve) for a $CsI/SnCl_2$ layered sample on a ceramic substrate.

Optical absorption spectra of $CsSnI_3$ thin films were measured at room temperature. A typical absorption spectrum of $CsI/SnCl_2$ layered films deposited on ceramics was displayed in FIG. 5 along with the PL spectrum taken from the same film. The absorption contribution from the substrate was removed and scatterings were considered through the integrating sphere.

The absorption spectrum reflected the nature of the inhomogeneity of the film in terms of composition and domain sizes. The value of the absorption coefficient was zero before the PL emission peak, but steeply took off after the PL emission peak. This behavior was a testimony for the direct band-gap of $CsSnI_3$, as taught by J. I. Pankove "Optical Processes in Semiconductors", Dover Publications, Inc., New York, 1971.

The shoulder riding on the absorption curve, ~50 meV away from the PL peak position, might associate with the second conduction band CB2 although more work is needed to fully understand the nature of absorption in $CsSnI_3$ thin films.

It should be emphasized that the PL was very intense under a weak photoexcitation indicating very high quantum efficiency, which is supportive to the direct band-gap assertion for the $CsSnI_3$ compound as predicted by calculations from the first principles. The PL line shape was inhomogeneously broadened with a spectral width of ~50 meV.

In summary, a perovskite semiconductor $CsSnI_3$ thin film, another member of the semiconductor family, has been deposited on a substrate. The methods of depositing the high optical quality polycrystalline thin films were disclosed. Using the quantum mechanical simulation tools and the methods of photoluminescence and optical absorption, it was verified that the thin film was a direct band-gap semiconductor with a band-gap of ~1.3 eV at 300 K°.

While the invention has been described in detail and with reference to specific examples and the embodiments thereof, it will be apparent to one skilled in the art that various changes and modifications can be made therein without departing from the spirit and scope thereof.

The invention claimed is:

1. A polycrystalline perovskite semiconductor thin film comprising $CsSnI_3$, wherein the polycrystalline perovskite semiconductor film has a polycrystalline domain size in the range 300 nm to 3000 nm.

2. The polycrystalline perovskite semiconductor thin film of claim 1, wherein the polycrystalline perovskite semiconductor film has a band-gap ranging from 0 to 5 eV.

3. A method for producing the polycrystalline perovskite semiconductor thin film of claim 1, comprising the steps of:
   providing a substrate;
   depositing a high purity layer of $Sn(M_1)_2$;
   depositing a high purity layer of CsI;
   repeating the depositing steps until two or more alternating layers are deposited;
   applying a rapid thermal annealing to activate a self-limiting chemical reaction of $Sn(M_1)_2$, with CsI forming the polycrystalline perovskite semiconductor thin film $CsSnI_3$;
   and wherein $M_1$ is selected from the group consisting of I, Cl, Br and combinations thereof.

4. The method of claim 3, wherein
   the high purity layer of $Sn(M_1)_2$ is deposited by using thermal evaporator; and
   the high purity layer of CsI is deposited by using e-beam evaporator.

5. The method of claim 3, wherein the depositing steps are carried out in vacuum ranging from $10^{-4}$~$10^{-6}$ Torr.

6. The method of claim 3, wherein the depositing temperature ranges from 15° C. to 35° C.

7. The method of claim 3, wherein $M_1$ is I; the rapid thermal annealing is carried out in an inert gas environment; and wherein the inert gas is selected from $N_2$, Ar and combinations thereof; and the rapid thermal annealing temperature ranges from 320° C. to 420° C., for a time ranging from 10s-20s.

8. The method of claim 3, wherein $M_1$ is Cl; the rapid thermal annealing is carried out in air or in an inert gas environment; and wherein the inert gas is selected from $N_2$, Ar and combinations thereof; and the rapid thermal annealing temperature ranges from 170° C. to 210° C., for a time ranging from 10s-20s.

9. The method of claim 3, wherein the number of alternating layers ranges from 2 to 100.

10. The method of claim 3, wherein the substrate is selected from glass, ceramic, and silicon.

* * * * *